(12) United States Patent
Koehler

(10) Patent No.: US 6,900,946 B2
(45) Date of Patent: May 31, 2005

(54) ZOOM SYSTEM, IN PARTICULAR, A ZOOM SYSTEM FOR AN ILLUMINATION DEVICE OF A MICROLITHOGRAPHIC PROJECTION SYSTEM

(75) Inventor: Jess Koehler, Oberkochen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/793,247

(22) Filed: Mar. 5, 2004

(65) Prior Publication Data

US 2004/0257669 A1 Dec. 23, 2004

Related U.S. Application Data

(63) Continuation of application No. PCT/EP02/09665, filed on Aug. 30, 2002.

(30) Foreign Application Priority Data

Sep. 5, 2001  (DE) .......................................... 101 44 244

(51) Int. Cl.[7] .............................................. G02B 15/14
(52) U.S. Cl. ...................................... 359/679; 359/432
(58) Field of Search ................................ 359/679, 432, 359/422

(56) References Cited

U.S. PATENT DOCUMENTS 5,237,367 A    8/1993  Kudo ........................... 355/67
5,245,384 A    9/1993  Mori ............................ 355/67
5,675,401 A   10/1997  Wangler et al. ................ 355/67
5,955,243 A    9/1999  Tanitsu ........................ 430/311
6,285,443 B1   9/2001  Wangler et al. ................ 355/67
6,563,567 B1 * 5/2003  Komatsuda et al. ........... 355/71

FOREIGN PATENT DOCUMENTS

| DE | 41 24 311 A1 | 1/1993 |
| DE | 44 21 053 A1 | 12/1995 |
| EP | 0 687 956 A | 12/1995 |
| EP | 0 744 663 A1 | 11/1996 |
| EP | 0 747 772 A1 | 12/1996 |
| EP | 1 014 196 A2 | 6/2000 |
| WO | WO 01/61411 A1 | 8/2001 |

* cited by examiner

*Primary Examiner*—Georgia Epps
*Assistant Examiner*—William Choi
(74) *Attorney, Agent, or Firm*—Sughrue Mion, PLLC

(57) ABSTRACT

A zoom system that is particularly suited to use on an illumination device of a microlithographic projection exposure system and is configured in the form of a focal-length-zooming lens. The lenses of the zoom system define an object plane (6) and an image plane (8) that is a Fourier transform of the object plane. Both an intermediate pupillary plane (25) that is conjugate to the image plane and an intermediate field plane (27) that is a Fourier transform of the image plane lie between the object plane (6) and image plane (8). At least one movable lens (31, 32) is arranged in the vicinity of these intermediate image planes (25, 27). The system is characterized by a large expansion of the illuminated area on the image plane for short lengths of travel and light weights of these movable lenses (31, 32).

52 Claims, 3 Drawing Sheets

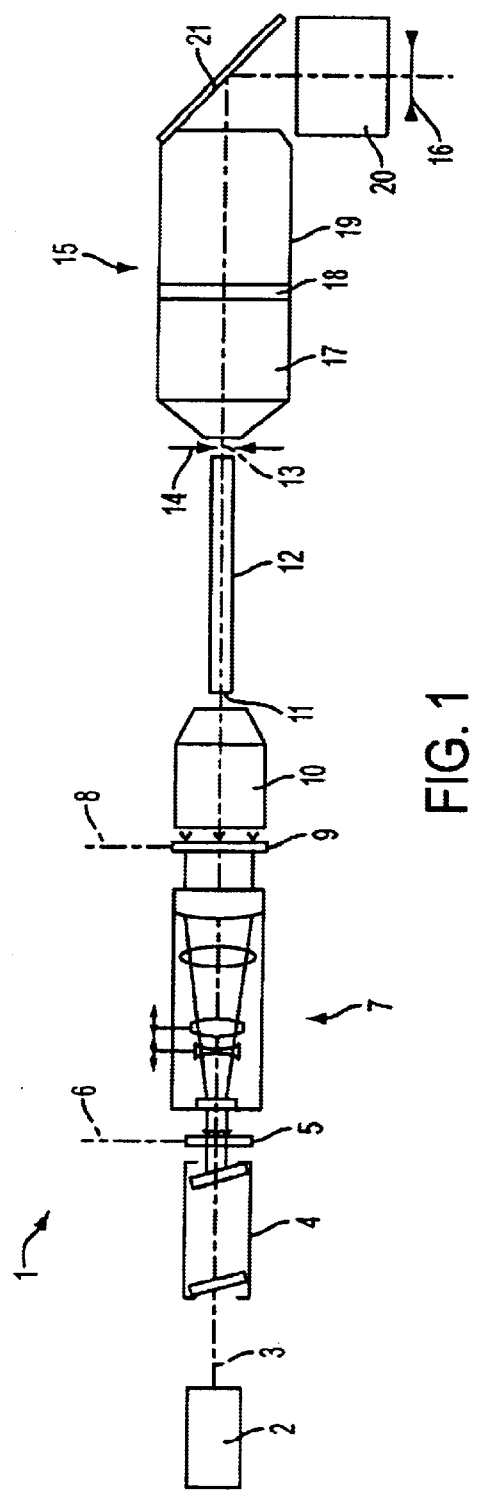
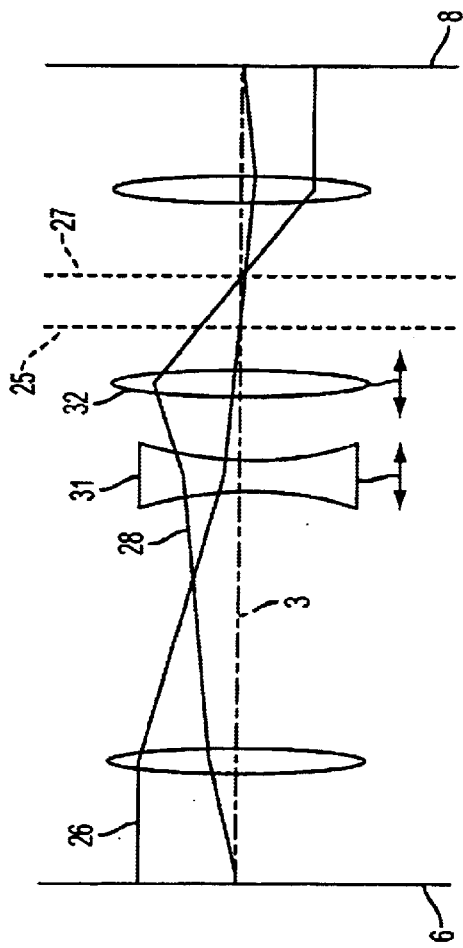
FIG. 1
FIG. 2

ZOOM SYSTEM, IN PARTICULAR, A ZOOM SYSTEM FOR AN ILLUMINATION DEVICE OF A MICROLITHOGRAPHIC PROJECTION SYSTEM

This is a Continuation of International Application PCT/EP02/09665, with an international filing date of Aug. 30, 2002, which was published under PCT Article 21(2) in German, and the disclosure of which is incorporated into this application by reference.

FIELD OF AND BACKGROUND OF THE INVENTION

The invention relates to a zoom system, in particular, a zoom system for an illumination device of a microlithographic projection exposure system.

The purpose of the illumination devices employed on microlithographic projection exposure systems is uniformly illuminating a reticle arranged in the object plane of a projection lens that follows the reticle in the optical train in a manner that has been accurately adapted to suit the optical properties of the projection lens. The illumination should be telecentric in order that the directed foci of all points in the plane of the reticle will be centered on the entrance pupil of the projection lens as accurately as possible. It may also be desirable to provide partially coherent illumination for which the extent to which that entrance pupil is filled will be variable and adjustable. Zoom systems may be employed for varying the degree of coherence of the illumination. In order to allow arriving at a close approximation to the limits of resolution of the optical projection during the photolithographic micropatterning process, the illumination is frequently optimized to suit the patterns on the individual layouts by creating various illumination modes, for example, annular illumination or quadrupole illumination. Devices, such as conical or pyramidal axicons, may be incorporated into zoom systems for that purpose, since there is a demand for high illumination efficiency in order to allow utilizing the light outputs of the light sources employed for fabricating microdevices with the least possible light losses.

Illumination devices that meet that demand well are disclosed in, for example, European Patent EP 0 747 772, German Patent DE 44 21 053, and European Patent EP 0 687 956. In the case of the illumination system of European Patent EP 0 747 772, the zoom system has a plurality of lenses that are arranged along an optical axis and define an object plane and an image plane that is a Fourier transform of the object plane. Two of its lenses are movable lenses that are movable along the optical axis when setting zooming positions of the zoom system in order to vary the size of an illuminated area on the image plane. Graticular, diffractive, optical elements bearing two-dimensional, graticular patterns are arranged in both the object plane and the exit pupil of the zoom lens. That arrangement suitably increases the light guidance factor, where that graticular optical element that is arranged in the object plane, together with the zoom system, introduce a small portion of the light guidance factor and the graticular optical element arranged in the image plane both generates the major share of the light guidance factor and adapts the illumination to suit the size of the illuminated field, for example, the rectangular entrance surface of a rod-shaped light integrator that follows it in the optical train. The graticular elements may also be called raster elements or rastered elements. The zoom system has a zoom ratio (expansion ratio) of three in order that partially coherent illumination having degrees of coherence ranging from 0.3 to 0.9 may be set.

Employment of a zoom system on the illumination device of a wafer stepper in order to allow adjusting the degree of coherence of the illumination with no light losses is known from U.S. Pat. No. 5,237,367.

An afocal zoom system for illuminating wafer steppers that also allows adaptation of the degree of coherence of the illumination with low light losses is known from U.S. Pat. No. 5,245,384.

An illumination system having an afocal optical system that serves as a beam expander in order to convert an incident light beam having parallel rays into an exiting light beam that has a larger cross-sectional area and also has parallel light rays is known from U.S. Pat. No. 5,955,243. The system has a first lens group having a negative refractive power on its entrance end that is followed by a second lens group having a high positive refractive power that jointly focus the incoming light beam onto a focal plane that is located at a distance behind the second lens group. A third lens group having a positive refractive power that collimates the divergent beam coming from the focal point is positioned at a large distance behind that focal plane. In the case of this arrangement, the energy density of the laser beam in the vicinities of the second and third lens groups, i.e., on both sides of the focal point, should be less than the energy density of the incoming laser beam, which is intended to allow avoiding radiation-induced damage to those lenses, where the distance between these lenses and the focal point should not be allowed to become less than a minimum distance.

In many applications, in particular, applications in the field of the microlithographic fabrication of semiconductor devices and other types of microdevices, it is desirable to be able to switch between various illumination settings without having to move lenses over large distances. In addition, it is frequently desirable to have available a large expansion ratio, i.e., a large range of image-size variation, in order to be able to, for example, selecting widely differing conventional illumination settings. A boundary condition that is becoming increasingly important, particularly at short wavelengths, for example, 193 nm, 157 nm, or shorter wavelengths, is minimizing the total number of optical surfaces in the system in order to limit transmission losses. Furthermore, a telecentricity of the exit end (image end) of the zoom system is beneficial in order to allow adapting it to suit the optical systems that follow it in the optical train, particularly in the case of illumination systems on which exclusively angle-maintaining optical elements, such as rod-shaped light integrators, are arranged following their zoom system.

OBJECTS OF THE INVENTION

One object addressed by the invention is devising a zoom system that will allow varying image size over a broad range for small displacements of its movable lenses. The zoom system should preferably also be characterized by telecentricity on its exit end and high transmittance and be suitable for use on an illumination device.

SUMMARY OF THE INVENTION

These and other objects are solved, according to one formulation of the invention, by a zoom system having a plurality of lenses that are arranged along an optical axis and define an object plane and an image plane that is a Fourier-transformed plane of the object plane. At least one of the lenses is a movable lens that is movable along the optical axis, thereby varying the size of an illuminated area lying in the image plane. A first intermediate image plane conjugate to the image plane and a second intermediate image plane that is a Fourier transform of the image plane lie between the object plane and image plane, and at least one of the lenses is arranged in a vicinity of at least one of the intermediate image planes. Specific beneficial embodiments are recited in the additional independent claims and the dependent claims. The wording of all claims is herewith made an integral part of this description by way of reference thereto.

In the case of a zoom system according to the invention, its lenses are figured and arranged such that a first intermediate image plane (intermediate pupillary image plane) conjugate to the image plane and a second intermediate image plane (intermediate field image plane) that is a Fourier transform of the image plane lie between the object plane and image plane. Further, at least one of the lenses of the zoom system is arranged in the vicinity of at least one of the intermediate image planes.

A focal-length zooming lens that images (images at infinity) a field plane (object plane) onto a pupillary plane (image plane) and has both an intermediate image of that field plane and an intermediate plane of that pupillary plane is thus proposed. The beam diameter preferably undergoes large variations in the vicinity of the intermediate image of the field plane, while the beam divergence preferably undergoes large variations widely in the vicinity of the intermediate pupillary image plane, which will be of assistance in obtaining beneficial correction effects in the vicinities of the intermediate images. If a lens is then arranged in the vicinity of the large variations in beam diameter and/or in the vicinity of the large variations in beam divergence, then a large expansion of the image field may be achieved for relatively small displacements of the location of the respective intermediate image plane involved relative to that of its associated lens. Since lenses located near intermediate images are also situated in vicinities where small beam diameters are small, it will be sufficient to employ small optical elements. Lightweight lenses that may be accelerated and braked using low applied forces may thus be employed. The zone near an intermediate image plane mentioned above is preferably characterized by the fact that the ratio of the local beam height within that optical near-field to the maximum beam height anywhere within the zoom system is less than, or equal to, about 0.5, in particular, is less than, or equal to, 0.3.

The design according to the invention also provides benefits in relation to correcting for the field and angular dependence of the irradiance distribution at the image plane. In order to obtain an approximately uniform power-density distribution at the image plane of the system, it will be beneficial to have a means for correcting it available in a plane, conjugate to that plane. It will also be beneficial if a means for optical correction is installed, or may be installed, in the vicinity of a plane that is a Fourier transform of the image plane in order to set the angular image distribution. Since the intermediate image planes that have been mentioned are such that they represent planes where corrections may be effectively employed, and lenses, in particular, movable lenses, are preferably employed there, the corrections for the field and angular dependence of the irradiance distribution at the image plane may depend upon zooming position.

In principle, the optical function of a single lens may also be provided by a combination of several lenses, i.e., a lens group, or by an additional aspherical surface. In general, the term "lens," as employed in this patent application, thus also encompasses lens groups.

In the case of preferred zoom systems, at least one movable lens is located in the vicinity of at least one intermediate image in order that image size may be varied largely by moving that lens. The system may also be designed such that the axial positions of intermediate images will be markedly displaced when switching between zooming positions, in which case, a fixed lens situated in the vicinity of an intermediate image may also contribute to alterations of image size. In the case of preferred embodiments, the major contribution to variations in image size comes from moving at least one lens situated in the vicinity of an intermediate image, where the locations of intermediate image planes may also be altered thereby.

Several embodiments are characterized by the fact that at least one of their lenses is arranged on the image side of an associated intermediate image in a first zooming position and is arranged on the object side of that intermediate image in a second zooming position, where the intermediate image plane involved is preferably a pupillary plane and that lens preferably passes through the vicinity of the intermediate image, whose location changes little, or not at all, when the lens is displaced. A displacement of the intermediate image only, in the case of a fixed lens, or a combination of both displacements, are also feasible. Since the variations in beam diameter and beam divergence reach their respective maxima in the vicinity of the intermediate image, obtaining large expansion ratios for minimal displacements is feasible in the case of these embodiments.

It will be particularly beneficial if the maximum length of travel of the movable lens is no more than about 10% of the overall length of the zoom system, which will be highly feasible when movable lenses are arranged in the vicinity of the intermediate image. The term "overall length," as used here, shall be defined as the axial distance between the object plane and the image plane of the zoom system. In the case of preferred embodiments, which will simplify incorporating zoom systems of that particular type into devices, for example, an illumination device of a wafer stepper, in cases where the space available for their incorporation is limited.

Preferred embodiments are capable of achieving image-field expansion ratios exceeding 4.0, in particular, exceeding 5.0. "Expansion ratio," or "expansion factor," D, shall here be defined as the ratio of a maximum radius of an illuminated area on the image plane to the associated minimum radius of that illuminated area on that plane. A sample embodiment having an expansion factor of 5.5 will be discussed in detail in conjunction with the figures.

In order to obtain a maximum expansion factor while maintaining the lengths of travel of individual lenses short, another embodiment has a first movable lens and at least a second movable lens that are movable along differing moving curves when switching between differing zooming positions, which may be achieved by, for example, employing independent drives or a suitable nonlinear coupling mechanism, where the displacements of the first movable lens and second movable lens are preferably coupled, or couplable, such that the length of an air-space between the lenses or lens groups will be nearly proportional to the image height in the vicinity of one of the lenses, which will simplify, among other things, the design of the controller of the drive mechanism.

Zoom systems in accordance with the invention allow a "lax" or "relaxed" beam guidance with minimum angles of incidence on the individual optical surfaces and designing a favorable distribution of refractive power, which will preferably be roughly symmetric with respect to the center of the zoom system. A distribution of refractive power in the order positive-negative-positive-positive will be favorable, where the leading and trailing positive refractive powers are provided by axially fixed lenses and the negative refractive power and the positive refractive power that follows it are provided by movable lenses. It will be favorable if their image-end positive refractive power exceeds, in particular, is about three times, their object-end refractive power, which will allow achieving low beam heights in the vicinity of their intermediate field image, compared to the size of the object involved. The refractive power of every movable lens or lens group preferably exceeds, in particular, is preferably more than twice, those of the fixed lens groups, which will concentrate strong optical effects in the vicinities of movable lenses, which will assist in obtaining large expansion ratios for short lens travels. In particular, the refractive powers of every one of the movable lenses may be larger, preferably at least five to ten times larger, than the maximum refractive power of the entire system.

The favorable beam guidance of preferred embodiments may also be characterized in terms of the focal length of the entire system, which will range from a minimum value, f1, to a maximum value, f2, that depend upon image diameter or the diameter of the illuminated area, where its minimum focal length is preferably less than its overall length, and may be less than one-third its overall length. However, its maximum focal length is preferably greater than its overall length, and may exceed twice its overall length. The ratio of its maximum focal length to its minimum focal length equal its expansion factor, D.

In the case of preferred embodiments, the total number of optical elements may be reduced compared to the zoom systems that have thus far been available, in spite of the additional full-scale imaging that takes place in zoom systems according to the invention. Such reductions may be achieved by arranging at least one optical component having at least one aspherical surface between the object plane and image plane. It will be particularly beneficial if at least one aspherical optical component that has an aspherical surface arranged in the vicinity of at least one intermediate image is provided. That aspherical surface should preferably be arranged on a movable optical element, which will allow varying the corrective effect of the aspherical surface over a broad range. In the case of a preferred system, at least one fixed lens and at least one movable lens both have at least one aspherical surface. In particular, more than one-third of its lenses may have aspherical surfaces, which will promote reducing both the total number of lenses required and the quantities of materials required for their fabrication. Zoom systems having fewer than 20 or 15 optical surfaces are feasible. Preferred are even fewer optical surfaces, for example, 12, or just 10, optical surfaces, as in the case of the five-lens zoom system depicted in the figures.

In order to preclude damage to lenses due to high radiant-energy densities, the system may be configured such that no optical materials are arranged in the immediate vicinity of a beam waist, i.e., in the immediate vicinity of a high energy-density near-field zone surrounding the intermediate field image (second intermediate image plane). This "high energy-density near-field zone" is dimensioned such that, outside this near-field zone, the diameters of the illuminated spots on lenses will be much larger than the minimum illuminated-spot diameter at the intermediate field plane. If, for example, such a zoom system is incorporated into an illumination device that has a graticular optical element having a two-dimensional graticular pattern that creates a focusing grating following it in the optical train is arranged in the object plane of the zoom system, that will allow providing that the image of the focusing grating lies within the zoom lens and that no optical materials are arranged in the vicinity of the image of the focusing grating. It may be provided that the maximum energy density of the light incident on an optical surface of the zoom system is invariably less than 1.5 times the energy density of light incident on the object plane, which will allow reliably preventing radiant-energy-density peaks that might lead to light-induced accumulations of contaminants on optical surfaces and/or damage lenses and shorten their service lives.

BRIEF DESCRIPTION OF THE DRAWINGS

The foregoing and other characteristics are as stated in both the claims and the description and depicted in the figures, where the individual characteristics involved may represent characteristics that are patentable alone or several such in the form of combinations of subsets thereof that appear in an embodiment of the invention and may be implemented in other fields, as well as beneficial embodiments that may themselves be patentable. The figures depict:

FIG. 1 a schematized overview of an embodiment of an illumination device for a microlithographic projection device equipped with an embodiment of a zoom system in accordance with the invention;

FIG. 2 a schematized representation of the paths of the marginal ray proceeding to the center of the field and the principal ray proceeding to the edge of the field for an embodiment of a zoom system according to the invention;

DETAILED DESCRIPTION OF THE PREFERRED EMBODIMENTS

Figure 3:
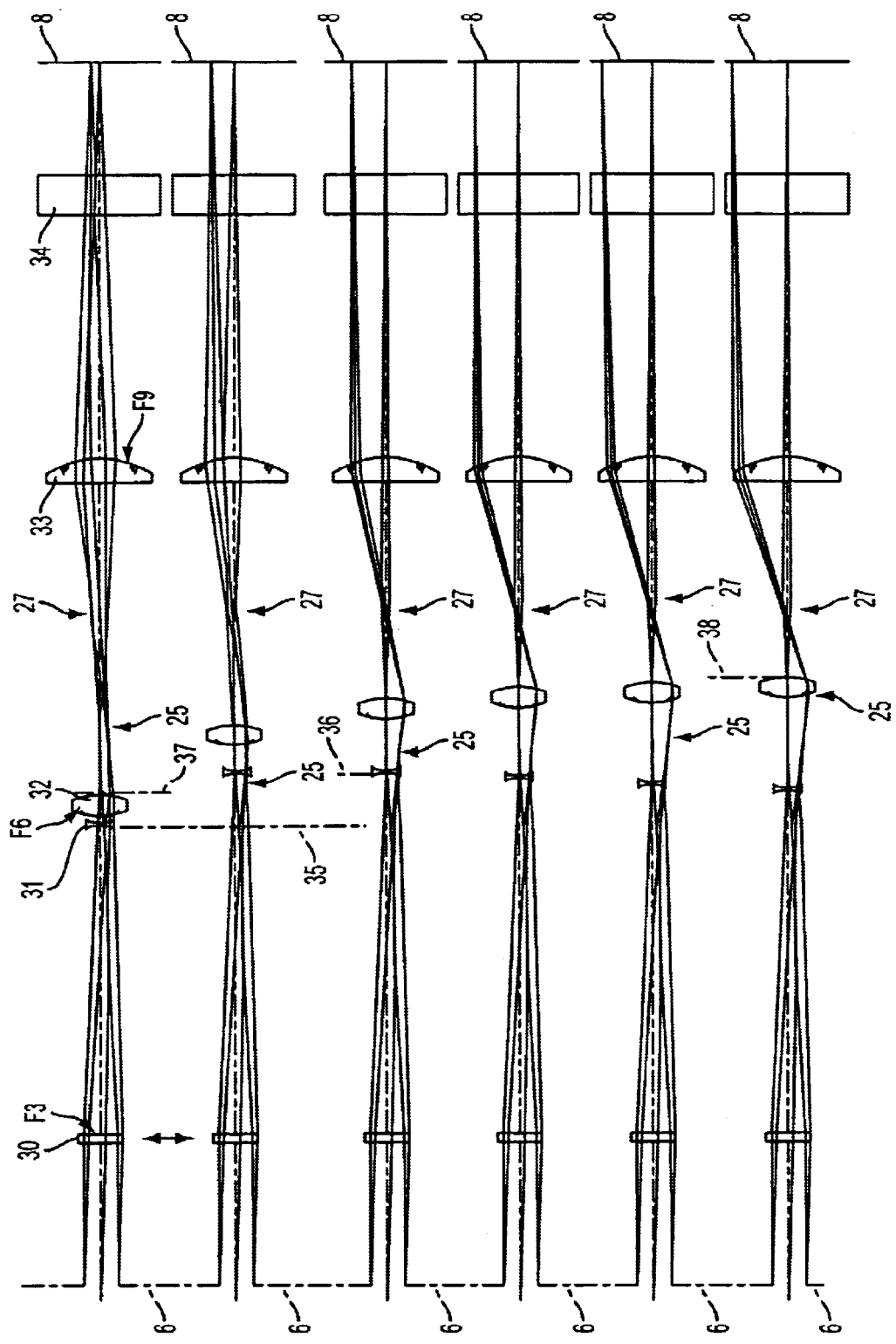
FIG. 3 sections through the lenses of an embodiment of a zoom system in accordance with the invention for six zooming positions.

FIG. 1 depicts an example of an illumination device 1 of a microlithographic projection exposure system that is employable for fabricating semiconductor devices and other types of microdevices and operates with light from the deep-ultraviolet spectral region in order to allow achieving spatial resolutions down to fractions of a micrometer. An F2 excimer laser having an operating wavelength of about 157 nm whose light beam is coaxial with the optical axis 6 of the illumination system serves as its light source 2. Other UV light sources, such as ArF excimer lasers operating at a wavelength of 193 nm, KrF excimer lasers operating at a wavelength of 248 nm, or mercury-vapor lamps having operating wavelengths of 368 nm or 436 nm, may also be employed. Light from the light source 2 is initially incident on a beam expander 4, which may, for example, be an arrangement of mirrors in accordance with German Patent DE 41 24 311, and serves to reduce coherence and increase the cross-section of its beam to, e.g., y=35 mm±10 mm and x=10 mm±5 mm. In the case of the embodiment shown, an optional shutter that would otherwise be provided is replaced by a suitable pulse controller for the laser 2.

A first graticular, diffractive, optical element (raster element) 5 is arranged in the object plane 6 of a zoom lens 7 arranged in the beam path, in whose image plane 8 or exit pupil a second graticular, diffractive, optical element (raster element) 9 is arranged.

Input-coupling optics 10 arranged following the latter in the optical train transmit the light to the entrance surface 11 of a rod-shaped light integrator 12 fabricated from calcium fluoride that mixes and homogenizes light transmitted by it through multiple internal reflections. An intermediate field plane in which a reticle/masking system (REMA) 14 that serves as an adjustable field stop is coincident with the exit surface 13 of the rod 12. The lens 15 that follows the latter in the optical train images that intermediate field plane and the masking system 14 onto reticle 16 (a mask or photolithographic layout) and contains a first lens group 17, an intermediate pupillary plane 18 into which filters or stops may be inserted, a second lens group 19 and a third lens group 20, and, situated between them, a deflecting mirror 21 that allows incorporating the long (approximately 3 m long) illumination device with its axis horizontal and mounting the reticle 16 with its plane horizontal.

Together with a projection lens (not shown) and an adjustable wafer holder that clamps the reticle 16 in the object plane of the projection lens, this illumination system forms a projection exposure system for the microlithographic fabrication of electronic circuit components, as well as diffractive optical elements and other types of microdevices.

In the case of a wafer stepper, the entire patterned surface, which will, in general, be a rectangle having an arbitrary aspect ratio ranging from, for example, 1:1 to 1:2, in particular, 1:1.3, corresponding to a microchip on the reticle 16 is illuminated as uniformly as possible, where the edges of the illuminated area are as sharply defined as possible.

In the case of a wafer scanner, a narrow strip, typically a rectangle having an aspect ratio ranging from 1:2 to 1:8, on the reticle is illuminated and the illuminated area progressively scanned over the entire patterned field of a microchip. Here, once again, the illumination should be arranged such that it is extremely uniform and has sharply defined edges along the direction orthogonal to the scanning direction.

In many cases, the illuminated area on the reticle 16 may also have other shapes. The aperture of the reticle/masking system 14 and the cross-sectional profile of the rod 12 should be accurately adapted to suit the required shape of the illuminated area.

The embodiments of the components, in particular, the graticular optical elements 5 and 9, preceding the rod-shaped light integrator 12 should be chosen such that the entrance surface 11 of the rod will be largely uniformly illuminated with the greatest possible efficiency, i.e., with no significant light losses due to overfilling its entrance surface. To that end, the divergence and profile of the collimated light beam from the beam expander 4, which has a rectangular cross-section and a non-axisymmetric divergence profile, are initially altered by the first graticular, diffractive, optical element 5 while increasing the light guidance factor. In particular, the first graticular, diffractive, optical element 5 has numerous hexagonal cells that yield a hexagonal angular irradiance distribution. The numerical aperture, NA, of the first graticular, diffractive, optical element is, for example, NA=0.025, which introduces around 10% of the total light guidance factor to be introduced. Together with the zoom optics 7, the first graticular, diffractive, optical element 5 arranged in the front focal plane of the zoom optics 7 yields an illuminated spot having a variable size on the rear focal plane, or image plane 8, of the zoom system, where the second graticular optical element 9, which is configured in the form of a refractive optical element yielding a rectangular irradiance profile, is arranged. This latter element provides the bulk of the light guidance factor and adapts it to suit the field size, i.e., the cross-sectional area of the rectangular entrance surface 11 of the rod-shaped light integrator 12, via the input-coupling optics 10.

Except for the zoom lens 7, the layout of the illumination system may, for example, conform to that described in European Patent EP 0 747 772 and its U.S. Patent counterpart U.S. Pat. No. 6,285,443B1, whose corresponding disclosures are herewith made an integral part of this description through this incorporation by reference. Other designs are also possible. For example, a module incorporating a honeycomb condenser and a field lens may be provided instead of the module incorporating the input-coupling group 10 and rod-shaped light integrator 12.

The layout, mode of operation, and special features of the zoom system 7 will be discussed in greater detail below. In order to clarify the imaging properties of the zoom system 7, FIG. 2 schematically depicts the paths of designated rays within the system. The zoom system 7 is a focal-length-zooming zoom lens whose object plane 6 and image plane 8 are Fourier-transformed planes. An intermediate pupillary image whose axial location is determined by the fact that a principal ray 26 from a point on the edge of the entrance field intersects the optical axis 3 there lies in a plane (first intermediate image plane) 25 conjugate to the image plane 8 lying between the object plane 6 and image plane 8. That principal ray will here also be termed a "field-edge-to-aperture-center ray" and propagates virtually parallel to the optical axis 3 at the location of the object plane 6. The second intersection of that principal ray 26 with the optical axis lies in the image plane 8. In addition, a second intermediate image plane 27 that is a Fourier transform of the image plane 8, in which an intermediate field image is arranged, lies between the object plane and image plane. The axial location of the intermediate field image plane, which is conjugate to the field plane 6, arises from the fact that the marginal rays 28 passing through the limiting aperture near its edges of a central beam coincident with the optical axis 3 intersect the optical axis a second time there. The field-edge-to-aperture-center ray 28 propagates virtually parallel to the optical axis 3 at the location of the image plane. The system is preferably designed such that the minimum beam height at the intermediate field image 27 is less than 50%, in particular, less than 20%, of the beam height at the object plane 6. This series of intermediate images between the object plane 6, which is a field plane, and image plane 8, which is a pupillary plane, discussed here based on a schematic drawing is given for all zooming positions of the zoom lens 7, where the axial locations of the intermediate pupillary image 25 and intermediate field image 27 may, however, vary.

The optical design of a preferred embodiment of a zoom system 7 having five lenses will now be discussed in greater detail, based on FIG. 3 and Table 1 through Table 3. That zoom system 7 has a fixed overall length (distance between its object plane and image plane) of about 1,220 mm. A biconvex first lens 30 having an entrance surface F2 and an exit surface F3 is arranged at a working distance of 144 mm from the field plane 6. That lens is followed by a biconcave second lens 31 that has a smaller diameter and is lighter than any of the zoom system's other lenses and has an entrance surface F4 and an exit surface F5 and is separated from the first lens by a variable air space. That lens is followed by a biconvex third lens 32 that has an aspherical entrance surface F6 and a spherical exit surface F7. The second lens 31 and third lens 32 are axially movable and represent the only lenses of the zoom system that are axially movable. The third lens 32 is followed by a fixed fourth lens 33 that has a positive refractive power, a nearly planar entrance surface F8, and an aspherical exit surface F9, and is separated from the third lens by a large distance. The fourth lens is followed by a fixed fifth lens 34 that has a convex entrance surface F10 and a planar exit surface F11 that is situated 110 mm ahead of the image plane 8, and is separated from the fourth lens by a fixed air-space. Alternatively, this latter lens 34 may be replaced by a pair of axicons having conical or pyramidal surfaces that face one another, that, preferably, may be slid together until they contact one another in order to allow selecting either conventional annular illumination or conventional quadrupole illumination. There is sufficient space available for installing an optional deflecting mirror between the fourth lens 33 and fifth lens 34. Light rays transiting this space have an angular spread of just 6° or so, which will allow employing a simple, but, nevertheless, effective, mirror coating.

Table 1 lists the radii of curvature, r [mm], of the lens surfaces, the associated thicknesses of the respective lenses, d [mm], and the half-maximum-intensity beam diameters, hmax [mm], that occur at their surfaces, F. Table 2 lists the aspheric constants of the aspherical surfaces F6 and F9 of the zoom system in the usual notation. Table 3 lists the axial lengths [mm] of the variable air-spaces that follow lens surfaces F3, F7, and F11 for six different zooming positions (Zoom Pos. 1 through Zoom Pos. 6, proceeding from top to bottom in FIG. 3). All lenses are fabricated from CaF2, which has a nominal refractive index, n, of n=1.558 at the operating wavelength of 157.63 nm. The axial locations of the intermediate pupillary plane 25 and intermediate field plane 27 are also indicated.

The functions and other special features of the zoom system will be discussed below. The object plane (field plane 6) is illuminated by an irradiance distribution having a rectangular profile and dimensions of about 20 mm×15 mm. The first graticular, diffractive, optical element 5 arranged in the object plane creates an angular irradiance distribution in the object plane that has a hexagonal shape in angle space. The mean numerical aperture there is 27 mrad. This light transits the lenses of the zoom system and creates a hexagonal illuminated area on the image plane 8, where the size of that illuminated area is continuously variable by varying the positions of the two movable lenses 31 and 32. In the case of this particular embodiment, the radius of the circle circumscribing the same area as this hexagon may be varied from a minimum of about 10 mm (zooming position 1, appearing at the top of FIG. 3) to a maximum of about 55 mm (zooming position 6, appearing at the bottom of FIG. 3), which corresponds to an expansion, or expansion ratio, of 5.5. The maximum image diameter is thus less than about 10% of the overall length of the zoom system, i.e., the zoom system is a "long" zoom system. For any zooming position, the variation in the energy density over the image plane 8 is about 5% or less, if the large variations occurring along the edges of the irradiance distribution are ignored. The directions of the principal rays in the image plane differ from the direction of the optical axis 3 by 1 mrad or less for any zooming position. The light beam incident on the image plane has a numerical aperture of less than about 0.055 for any zooming position, which provides that the exact location of the image plane, which varies with zooming position, will have little effect on the irradiance distribution at the real, fixed, image plane. Moreover, the respective angular distributions within such low-numerical-aperture irradiance distributions have only a very slight effect on imaging performance. The minimum illuminated area in the image plane is less than the area of the illuminated spot in the object plane and the maximum illuminated area in the image plane exceeds the area of the object plane.

Figure 4:
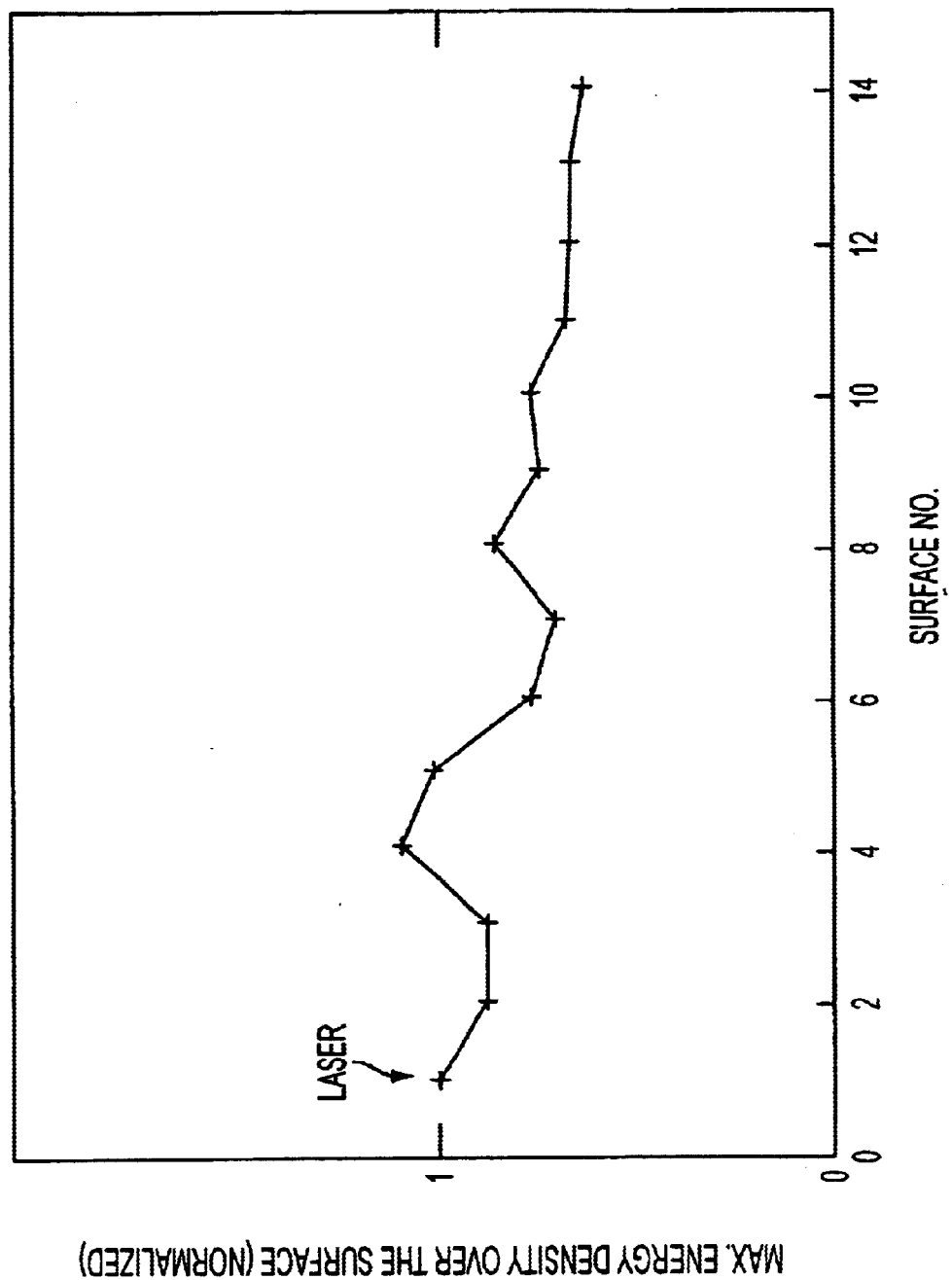
FIG. 4 a plot of the maximum energy density, normalized to the energy density of the laser involved, of laser light incident on an optical surface as a function of the optical surface of the zoom system.

The maximum energy densities occurring at the various system surfaces shown in FIG. 4 are less than 1.5 times the energy density of the laser light at the object plane 6 for all of the optical surfaces F2 through F11. Thus, none of the lenses of the zoom system are subjected to excessively high radiant-energy densities, which is largely due to the fact that no optical materials are arranged within the high-radiant-energy-density near-field of the intermediate field image plane 27 for any zooming position, which will be evident from, among other factors, the fact that this high-radiant-energy-density focal point falls within the central third of the air-space between the movable third lens 32 and the fixed fourth lens 33 for any zooming position, or from the fact that the diameters of the illuminated spots at the locations of those lenses 32 and 33 are much larger than the minimum diameter of the illuminated spot at the intermediate field plane. If a focusing grating, which may be created from, e.g., a graticular optical element, is arranged in the vicinity of the object plane, then the image of this focusing grating will also be situated far away, in terms of energy densities, from any optical materials, since the image of this focusing grating will lie in the vicinity of the intermediate field plane 27.

This favorable energy distribution is also evident from the fact that there is at least one lens whose illuminated area has a diameter that at least 90% of the lens' diameter for any zooming position. In the case of the sample embodiment considered, this condition is met by the first fixed lens 30 and the first movable lens 31. Lenses that meet this condition will be subjected to similar energy densities for any zooming position, which is particularly useful in the case of this particular embodiment, since it employs lenses that have relatively small diameters. It also has a movable lens 32 and fixed lenses 33 and 34 whose illuminated areas vary widely and have diameters that range from 60% to 100% of the respective lens diameter involved. Although the energy densities to which these lenses are subjected for differing zooming positions vary widely, in practice, this has no adverse effects in the case of this particular embodiment, since all of the lenses involved have rather large diameters. One benefit of the relatively wide variations of the diameters of the illuminated spots involved is that areas near the edges of the lenses may be utilized for zooming positions yielding large-diameter images, while the central areas of their surfaces may be utilized for correcting for imaging errors that occur for zooming positions yielding small-diameter images.

In the case of zoom systems in accordance with the invention, the large expansion ratio, D, involved is obtained for relatively short axial travels of their movable lenses, which may also have small diameters and be lightweight, since they are arranged in the vicinity of at least one intermediate image 25 and 27 of the system. Both of their movable lenses 31 and 32 are singlets in order that small quantities of lens material will have to be repositioned and the mechanisms employed for moving them may be simply constructed. In particular, that lens 31 that is lightest in weight is a movable lens. It may be provided that the diameter of at least one of the movable lenses is less than 40%, in particular, less than 25%, of the maximum image diameter. From FIG. 3, it may be seen that the second lens 31 must be axially repositioned by no more than about 55 mm, which corresponds to less than 5% of the overall length of the zoom system, in order to shift it between its position 35 closest to the object (zooming position 1) and its position 36 closest to the image (zooming position 3). The third lens 32 is repositioned by less than 120 mm, which corresponds to less than 10% of the overall length of the zoom system, in shifting it between its position 37 closest to the object (zooming position 1) and its position 38 closest to the image (zooming position 6). Together with the light weights of the movable lenses, this means that small quantities of energy will be required for moving these lenses.

From FIG. 3, it may also be readily seen that there is no simple, linear, relationship between the moving curves of the movable lenses 31 and 32. On the contrary, the position of the larger lens 32 is continuously shifted closer to the image plane when switching from zooming position 1, which yields the smallest-diameter illuminated area, and zooming position 6, which yields the largest-diameter illuminated area, while the position of the smaller of these two lenses 31 is shifted toward the image when switching from zooming position 1 to zooming position 2, remains virtually unaltered when switching from zooming position 2 to zooming position 3, and is then shifted toward the object plane 6 when switching from zooming position 3 to zooming position 6, which may be accomplished either by employing separate drives for the movable lenses 31 and 32 or by employing a nonlinear mechanism for coupling these lenses. It may be seen that the length of the air-space between the pair of movable lenses 31 and 32 is roughly proportional to the image height within that air-space, which simplifies controlling their motions.

It may also be seen that the axial distance between a movable lens and a fixed lens invariably exceeds twice the maximum length of travel of the movable lens, which leaves a substantial amount of space available for installing the drive mechanisms for movable lenses. The movable lenses 31 and 32 are located in the central third of the zoom system 7, which leaves sufficient space available for installing the guide rails along which these movable elements are may be repositioned. Sufficient space remains available axially outside this space for accommodating these guide rails for accommodating an optional device for changing the graticular optical element 5 and/or for accommodating a deflecting mirror, if any, that may be present in the zoom system, where that deflecting mirror may be arranged between the fixed lenses 33 and 34. No fixed lenses are situated between the movable lenses, which eliminates restrictions on the lengths of travel of these lenses. For some particular zooming position, the first movable lens 31 may be located at a position where the second movable lens 32 was arranged for some other zooming position, which allows designing the zoom system such that there will invariably be a minimum distance remaining between the movable lenses, which, in the case of the sample embodiment involved, will be at least 25% of the minimum image diameter. The movable lenses will thus be separated by a minimum distance at all times in order that collisions due to overshooting, which may, at least in principle, occur at high accelerations, will be precluded, which will, in turn, improve the reliability of the zoom system in operation.

It may also be seen that the larger of the movable lenses passes through the vicinity of the intermediate pupillary image 25 when switching between zooming positions. That intermediate pupillary image lies on the image side of the third lens 32 for zooming position 1, within the third lens 32 for zooming position for zooming position 2, and on the object side of the third lens 32 for all other zooming positions. Since the entrance surface F6 of the third lens 32 is an aspherical surface that wanders through the vicinity of the intermediate pupillary image, this aspherical surface may have a particularly strong impact on the imaging performance attainable by the zoom system that may be utilized for correcting for the dependence of the irradiance distribution in the image plane 8 on the size of the illuminated field and angle of incidence for given zoom positions.

The special features of zoom systems in accordance with the invention are also evident from their refractive-power distribution. An axially fixed lens or lens group having a positive refractive power is followed by an axially movable lens or lens group having a negative refractive power. That lens or lens group is followed by an axially movable lens or lens group having a positive refractive power and an axially fixed lens or lens group having a positive refractive power, where the refractive power of this second fixed lens group preferably exceeds that of the first fixed lens group, and is preferably at least three times that of the first lens group. This refractive-power distribution is reflected in the aforementioned very low, compared to the size of the object, image height at the location of the intermediate field image 27. Also conspicuous is that the refractive powers of each of the movable lenses 31 and 32 exceed those of the fixed lenses or lens groups, in particular, are more than twice the refractive powers of the latter, which concentrates a great deal of optical influence in the vicinity of the movable lenses, which, in turn, assists in obtaining large variations in image size for short lengths of travel of the movable lenses. The refractive powers of each of the movable lenses 31 and 32 exceeds the refractive power of the entire system, and, in particular, may even be ten or more times the latter's refractive power, which is also reflected in the favorable concentration of optical influence in the vicinity of the movable lenses for short lengths of travel.

This refractive-power distribution is qualitatively roughly symmetric with respect to the midpoint of the zoom system's axis, which allows achieving a relatively "lax" beam guidance within its optics that, among other reasons, will be evident from the fact that the maximum angle of incidence i for radiation striking an optical surface of the zoom system is 44° (sin i<0.69) or less for any zooming position, where "angle of incidence" is defined as the angle between the direction of incidence of a light beam and the local normal to an optical surface at the point of incidence. These low angles of incidence are favorable for avoiding imaging errors and, most importantly, allow effectively anti-reflection coating the optical surfaces of its lenses using suitable anti-reflection coatings, which will allow increasing the transmittance of the entire system and eliminating stray light.

This relatively "lax" beam guidance is also evident from the system's focal lengths. In the case of the embodiment shown, the focal length of the zoom system is f1=308 mm for the zooming position that yields the minimum image diameter (zooming position 1) and f2=2,031 mm for the zooming position that yields the maximum image diameter (zooming position 6), which complies with a condition on focal lengths that relates the focal length, f1, yielding the minimum image diameter to the focal length, f2, yielding the maximum image diameter and the overall length (OL) of the system that has been recognized as particularly beneficial, according to which, it will be particularly beneficial if that overall length exceeds f1, in particular, is at least three times f1, and/or if that overall length is less than f2, in particular, is less than half f2.

The first lens 30 is mounted such that it may be repositioned along mutually orthogonal axes orthogonal to the optical axis 3. The zoom system is designed such that, to a first approximation, decentering this first lens off the optical axis will yield merely an offset of the image field. Typical decenterings might range from fractions of a millimeter to several millimeters. This decentering may be utilized for reducing, or fully compensating for, displacements of the image field, due to, for example, tolerances in the optical elements and/or their mountings. The first lens 30 is also situated close to the object plane 6, at a distance therefrom that corresponds to 15% or less of the overall length of the zoom system, which both aids cleaning the space between the graticular optical element 5 and the zoom system 7 using gas purging and simplifies correcting for aberrations, in particular, spherical aberrations, which demands an energy distribution in the image plane having narrow bordering zones. The zoom system may be adapted to suit the irradiance distribution at its object end, e.g., its field size, field shape, numerical aperture, and the directions of its principal rays. In particular, the basic principle underlying the zoom system will remain unchanged if the telecentric irradiance distribution at its object plane is replaced by a uniform irradiance distribution.

The invention also encompasses a method for altering the irradiance distribution at the image plane 8 without altering the positions of the lenses of the zoom system. It has been found that tilting and/or decentering the irradiance distribution of the laser at the entrance end of the zoom system may be utilized for setting a constant image displacement and a constant angular tilt of the irradiance distribution at the image plane of the zoom system, regardless of the zooming position involved. Defined as "tilting" here is angularly altering the direction of propagation of the laser beam relative to the optical axis of the illumination system. "Decentering" of the irradiance distribution at the zoom system's entrance end is defined as displacing this irradiance distribution along a direction orthogonal to the optical axis.

Manipulating or readjusting the convergence/divergence of laser radiation entering the illumination device instead of, or in addition to, that tilting and/or decentering will allow altering the axial location (position along the z axis) of the image plane for a given zooming position. This manipulation of the location of the image plane 8 along the z axis by varying the convergence/divergence of the incident laser beam proposed here may be utilized for adjusting or setting the axial location of the image plane 8 of the zoom system. The convergence/divergence of laser radiation incident on the zoom system may be varied by, for example, inserting and/or moving optical elements in the beam path ahead of the zoom system, for example, inserting and/or moving lenses and/or manipulating the beam divergence using the beam expander 4, which will allow providing that the principal rays of the laser radiation will no longer be virtually parallel to one another, but will converge, which will shift the location of a nearly point-like light source from infinity to a finite distance away. This introduction of convergence/divergence is to be distinguished from introduction of a stop using a DOE or similar, which introduces a stop or angular irradiance distribution for given, locally unaltered, principal rays. This method is useful for, for example, correlating the locations of the image planes 8 for the various zooming positions of installed zoom lenses without making any structural changes to the zoom system. For example, varying the directions of the principal rays of the incident laser beam by 0.1 mrad for a given zooming position will axially displace the image plane 8 by about 10 mm (for zooming position 1) and as much as 500 mm (for zooming position 5), which correspond to displacements ranging from about 1% and 50%, respectively, of the overall length of the zoom system. The location of the image plane associated with the zooming position yielding the largest illuminated area may thus be varied, virtually independently of the location of the image plane yielding the minimum illuminated area. This method may also be utilized on other illumination devices, regardless of the type of zoom system involved.

The invention has been described based on a zoom system for an illumination device of a microlithographic projection system. However, the invention is not confined to that application. Zoom systems in accordance with the invention may also be employed as imaging systems, for example, as photographic zoom lenses. In keeping with their application in conjunction with an illumination system that has been described here, the quality of these systems is characterized by the uniformity of their irradiance distribution, their edge width, their telecentricity, etc. These characteristics are directly equivalent to imaging errors that characterize their imaging optics. For example, the uniformity of their irradiance distribution is equivalent to distortion, i.e., to image distortion. Their edge width corresponds to the sharpness of their images, or the spatial resolution of their imaging optics. In the case of imaging systems, telecentricity will be an essential requirement only if the detector, for example, a photosensitive layer, situated in their image plane reacts differently to light coming from differing directions of incidence. Their freedom from vignetting is equivalent to uniform illumination over their image field, in which a film to be exposed is situated.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all such changes and modifications as fall within the spirit and scope of the invention, as defined by the appended claims, and equivalents thereof.

TABLE 1

| Surface No. | r (mm) | d (mm) | $h_{max}$ [mm] |
|---|---|---|---|
| F1 | 0.0 | 144.29 | 16.50 |
| F2 | 376.148 | 8.00 | 20.41 |
| F3 | −484.148 | 307.053 | 20.40 |
| F4 | −64.925 | 4.00 | 12.15 |
| E5 | 93.605 | 5.10 | 12.46 |
| F6 | 52.433 | 21.00 | 25.46 |
| F7 | −59.443 | 317.642 | 25.38 |
| F8 | −2538.89 | 23.00 | 46.76 |
| F9 | −89.597 | 240.065 | 48.88 |
| F10 | 800.00 | 40.00 | 56.33 |
| F11 | 0.0 | 110.00 | 56.07 |

TABLE 2

| Surface No. | Conicity Constant, k | C1 | C2 | C3 | C4 |
|---|---|---|---|---|---|
| F6 | −0.50178 | −2.3893 e-06 | −1.02488 e-09 | 7.7479 e-13 | −1.0364 e-16 |
| F9 | 1.32194 | 2.4680 e-07 | 1.4767 e-120 | −4.4164 e-14 | 1.667 e-17 |

TABLE 3

| Surface No | Zoom Pos. 1 | Zoom Pos. 2 | Zoom Pos. 3 | Zoom Pos. 4 | Zoom Pos. 5 | Zoom Pos. 6 |
|---|---|---|---|---|---|---|
| F3 | 307.05 | 358.51 | 362.07 | 352.29 | 345.10 | 338.04 |
| F5 | 5.10 | 24.12 | 46.02 | 67.84 | 79.15 | 89.34 |
| F7 | 317.64 | 247.17 | 221.70 | 209.66 | 205.55 | 202.42 |

What is claimed is:

1. A zoom system comprising:
a plurality of lenses that are arranged along an optical axis and define an object plane and an image plane that is a Fourier-transformed plane of the object plane,
wherein at least one of the lenses is a movable lens that is movable along the optical axis, thereby varying the size of an illuminated area lying in the image plane, and
wherein a first intermediate image plane conjugate to the image plane and a second intermediate image plane that is a Fourier transform of the image plane lie between the object plane and image plane, and at least one of the lenses is arranged in a vicinity of at least one of the intermediate image planes.

2. A zoom system according to claim 1, wherein at least one of the movable lenses is arranged in the vicinity of at least one of the intermediate image planes.

3. A zoom system according to claim 1, wherein the position of at least one of the intermediate image planesis variable by moving movable lenses.

4. A zoom system according to claim 1, wherein at least one of the lenses is arranged on the image side of one of the intermediate images for a first zooming position of the zoom system and on the object side of that the one intermediate image for a second zooming position of the zoom system.

5. A zoom system according to claim 4, wherein the one intermediate image plane is a pupillary intermediate image plane.

6. A zoom system according to claim 1, wherein the divergence of the transmitted beam is strongly altered in the vicinity of the first intermediate image plane and the diameter of the transmitted beam is strongly altered in the vicinity of the second intermediate image plane.

7. A zoom system according to claim 1, wherein the minimum beam height at s second of the intermediate image planes is less than 50% of the beam height at the object plane.

8. A zoom system according to claim 1, wherein a maximum moving range of the movable lenses is no more than about 10% of the overall length of the zoom system.

9. A zoom system according to claim 1, wherein a maximum moving range of the movable lenses equals at most the maximum illuminatable diameter at the image plane.

10. A zoom system according to claim 1, wherein at least one of the movable lenses has a maximum moving range that is no more than about 5% of the overall length of the zoom system.

11. A zoom system according to claim 1, wherein a distance between a movable lens and a fixed lens invariably exceeds the maximum moving range of the movable lens.

12. A zoom system according to claim 1, wherein each of the movable lenses is a singlet lens.

13. A zoom system according to claim 1, wherein all of the movable lenses are arranged in a middle third of the zoom system, between the object plane and image plane.

14. A zoom system according to claim 1, wherein the maximum diameter of the illuminated area at the image plane is less than about 10% of the overall length of the zoom system.

15. A zoom system according to claim 1, wherein a minimum distance between the movable lenses is at least 25% of the maximum illuminatable diameter at the object plane.

16. A zoom system according to claim 1, wherein the movable lens is a lens that weighs the least among the plurality of lenses.

17. A zoom system according to claim 1, wherein no fixed lenses are arranged between the movable lenses.

18. A zoom system according to claim 1, wherein a ratio of a maximum size of the illuminated area lying in the image plane to a minimum size of the area is at least four.

19. A zoom system according to claim 1, wherein at least one of the movable lenses has a maximum illuminatable diameter that is less than 50% of the maximum illuminatable diameter at the image plane of the zoom system.

20. A zoom system according to claim 1, wherein the plurality of lenses comprises at least one of at least one movable lens) and at least one fixed lens having an illuminated area that has a diameter that is at least 80% of the diameter of the lens for any zooming position.

21. A zoom system according to claim 1, wherein the plurality of lenses comprises at least one at least one fixed lens and at least one movable lens having an illuminated area that has a widely variable diameter that ranges from about 60% to about 100% of the diameter of the lens.

22. A zoom system according to claim 1, wherein the plurality of lenses comprises a first movable lens and at least a second movable lens) that are movable along differing moving curves when switching between differing zooming positions are provided.

23. A zoom system according to claim 22, wherein the motions of the first movable lens and the second movable lens are coupled, such that the length of an air space between those lenses is at least nearly proportional to the image height in the vicinity of the first and second movable lenses.

24. A zoom system according to claim 1, wherein at least one optical component having at least one aspherical surface is arranged between the object plane and image plane.

25. A zoom system according to claim 1, wherein at least one optical component having at least one aspherical surface that is arranged between the object plane and image plane is arranged in the vicinity of an intermediate image.

26. A zoom system according to claim 1, wherein at least one movable optical component having at least one aspherical surface is arranged between the object plane and image plane.

27. A zoom system according to claim 1, wherein at least one fixed lens and at least one movable lens have at least one respective aspherical surface.

28. A zoom system according to claim 1, wherein more than one-third of all of the plurality of lenses have an aspherical surface.

29. A zoom system according to claim 1, wherein no optical materials are arranged within an intensely illuminated near field surrounding a field intermediate image for any zooming position.

30. A zoom system according to claim 1, wherein an energy density of the light incident on an optical surface does not exceed the luminous energy density at the object plane for any of the optical surfaces arranged between the object plane and image plane.

31. A zoom system according to claim 1, wherein at least one of the plurality of lenses is mounted to be transversely decentered with respect to the optical axis of the zoom system.

32. A zoom system according to claim 1, wherein at least one optical element is arranged in the vicinity of the object plane, where a distance between the object plane and the optical element is less than 15% of the overall length of the zoom system.

33. A zoom system according to claim 1, wherein the image end of the zoom system is telecentric.

34. A zoom system according to claim 1, wherein the zoom system operates at least largely without any vignetting.

35. A zoom system according to claim 1, wherein fewer than 15 optical surfaces are provided between the object plane and image plane.

36. A zoom system according to claim 1, wherein space for incorporating a deflecting mirror is present between fixed lenses, where the angles of incidence of light rays are less than 10° in the vicinity of the space.

37. A zoom system according to claim 1, wherein the minimum diameter, f1, and the maximum diameter, f2, of an illuminated area in the image plane satisfies at least one of the following conditions relating to the overall length OL of the zoom system:

OL>f1, and

OL<f2.

38. A zoom system according to claim 37, wherein:

OL>3f1, and

OL<f2/2.

39. A zoom system according to claim 1, wherein a fixed lens having a positive refractive power, a movable lens having a negative refractive power, a movable lens having a positive refractive power, and a fixed lens having a positive refractive power are arranged following one another in the optical train.

40. A zoom system according to claim 1, wherein said plurality of lenses comprises a first and a second movable lens, and wherein the refractive power of the second movable lens is at least three times the refractive power of the first movable lens.

41. A zoom system according to claim 1, wherein every movable lens has a refractive power that exceeds the refractive power of every fixed lens.

42. A zoom system according to claim 1, wherein every movable lens has a refractive power that exceeds the refractive power of the entire zoom system.

43. A zoom system according to claim 1, wherein every movable lens has a refractive power that is at least five times the refractive power of the entire zoom system.

44. A zoom system according to claim 1, wherein a maximum angle of incidence for radiation incident on an optical surface is less than 50°.

45. A zoom system according to claim 1, wherein the light beam at the image plane has a numerical aperture that is less than 0.055 for any zooming position of the zooming system.

46. A zoom system according to claim 1, wherein the zoom system is assigned an arrangement configured to adjust the axial position of the image plane along the optical axis.

47. A zoom system according to claim 46, wherein the adjusting arrangement includes at least one device configured to alter the convergence of radiation from a light source.

48. An illumination system for a microlithographic projection exposure system, comprising:

a zoom system for varying the coherence of the illumination supplied by the illumination system, said zoom system comprising:

a plurality of lenses that are arranged along an optical axis and define an object plane and an image plane that is a Fourier-transformed plane of the object plane, wherein at least one of the lenses is a movable lens that is movable along the optical axis, thereby varying the size of an illuminated area lying in the image plane, and wherein a first intermediate image plane conjugate to the image plane and a second intermediate image plane that is a Fourier transform of the image plane lie between the object plane and image plane, and at least one of the lenses is arranged in a vicinity of at least one of the intermediate image planes.

49. An illumination system according to claim 48, wherein a graticular optical element, designed to create a focusing grating configured to produce an image of the focusing grating within the zoom system, where no optical materials are arranged in the vicinity of the image of the focusing grating, is arranged in the object plane of the zoom system.

50. An illumination system according to claim 48, wherein the zoom system has an object plane and an image plane, and wherein the zoom system further comprises means for adjusting the axial position of the image plane.

51. An illumination system according to claim 50, wherein the means for adjusting comprises means for altering the convergence of radiation from a light source of the illumination system along the direction of radiation travel, prior to entering the zoom system.

52. A method for fabricating at least one of semiconductor devices and non-semiconductor microdevices, comprising:

illuminating a reticle arranged in an object plane of a projection lens using an illumination device that includes a zoom system that comprises a plurality of lenses that are arranged along an optical axis and define an object plane and an image plane that is a Fourier-transformed plane of the object plane, wherein at least one of the lenses is a movable lens that is movable along the optical axis, thereby varying the size of an illuminated area lying in the image plane, and wherein a first intermediate image plane conjugate to the image plane and a second intermediate image plane that is a Fourier transform of the image plane lie between the object plane and image plane, and at least one of the lenses is arranged in a vicinity of at least one of the intermediate image planes; and imaging the reticle onto a photosensitive substrate;

wherein said illuminating the reticle includes altering properties of the light beam incident on the reticle by moving at least one lens of the zoom system along the optical axis of the zoom system.

* * * * *